United States Patent
Fudoo et al.

[11] Patent Number: 5,412,861
[45] Date of Patent: May 9, 1995

[54] APPARATUS FOR LAYING A WIRE IN A JUNCTION BOX

[75] Inventors: Eiji Fudoo; Takayuki Yamada; Yuuji Saka, all of Yokkaichi, Japan

[73] Assignee: Sumitomo Wiring Systems, Ltd., Japan

[21] Appl. No.: 247,474

[22] Filed: May 23, 1994

Related U.S. Application Data

[63] Continuation of Ser. No. 21,356, Feb. 23, 1993, abandoned.

[30] Foreign Application Priority Data

Mar. 9, 1992 [JP] Japan .................................. 4-086457

[51] Int. Cl.$^6$ .............................................. H01R 43/00
[52] U.S. Cl. ................................. 29/564.2; 29/739; 29/745; 29/850; 83/620
[58] Field of Search ..................... 29/749–751, 29/842, 850, 739, 33 M, 755, 745, 564.7, 564.8, 566.3, 564.2; 140/92.1, 93 R; 83/620, 451

[56] References Cited

U.S. PATENT DOCUMENTS

| | | | |
|---|---|---|---|
| 3,258,039 | 6/1966 | Ewalt | 29/755 X |
| 3,804,130 | 4/1974 | Tarbox et al. | 29/755 X |
| 3,842,496 | 10/1974 | Mercer | 174/72 A X |
| 4,030,527 | 6/1977 | Roch | 29/755 X |
| 4,348,805 | 9/1982 | Gibbons | 29/857 |
| 4,387,509 | 6/1983 | Dechelette | 29/850 |
| 4,387,509 | 6/1983 | De Chelette et al. | 29/850 |
| 4,433,479 | 2/1984 | Suzuki et al. | 29/825 |
| 4,440,053 | 4/1984 | Suzuki et al. | 29/861 X |
| 4,593,452 | 6/1986 | Keahey et al. | 29/755 X |
| 4,677,734 | 7/1987 | Bloch et al. | 29/755 X |
| 4,684,765 | 8/1987 | Beck . | |
| 4,715,100 | 12/1987 | Cross | 29/755 X |
| 5,051,449 | 10/1991 | Fukuda et al. | 29/755 X |

FOREIGN PATENT DOCUMENTS

| | | |
|---|---|---|
| 182591 | 5/1986 | European Pat. Off. . |
| 2095135 | 9/1982 | United Kingdom . |
| 2212672 | 7/1989 | United Kingdom . |

*Primary Examiner*—William Briggs
*Attorney, Agent, or Firm*—Jordan B. Bierman; Bierman and Muserlian

[57] ABSTRACT

An apparatus for laying a wire in a junction box comprises means for performing the steps of: setting (S1) a covered wire E on a wiring plate along a wiring pattern arranged on said wiring plate by causing a relative movement between a wire feeder which successively feeds a single wire and the wiring plate along guide means formed on the wiring plate; cutting off (S2) portions unnecessary for conductive circuits from the wiring set on the wiring plate; and forming (S3) the conductive circuits in the junction box by inserting the wire remaining on the wiring plate into the wire-coupling portions of connecting terminals secured to a base and by removing the junction box from the wiring plate. Thus, it is possible to speed up the wire-laying work in a junction box having many conductive circuits.

9 Claims, 13 Drawing Sheets

APPARATUS FOR LAYING A WIRE IN A JUNCTION BOX

This is a continuation of application Ser. No. 08/021,356, filed Feb. 23, 1993, now abandoned.

This Application claims the benefit of the priority of U.S. application Ser. No. 08/021,356, filed Feb. 23, 1993, which claims the priority of Japanese Application 86457/92, filed Mar. 9, 1992.

BACKGROUND OF THE INVENTION:

1. Field of the Invention

This invention relates to a method for laying a wire in a junction box to form conductive circuits in the junction box which is used in, for example, electrical wiring for a motorcar.

2. Statement of the Prior Art

In a connecting assembly, in the so-called joint box or junction box (hereinafter referred to as "junction box") used in the electrical wiring in a motorcar, heretofore, the conductive circuits in the junction box were generally constructed by bus bars. However, very expensive dies and a large press machine are required to make the bus bars and many unnecessary portions are left in a blank metal sheet after it is punched, thereby making the bus bars costly. Further, the bus bars lack an antileak characteristic since they expose their conductive faces. Consequently, as disclosed in, for example, unexamined Japanese Patent Public Disclosure No. 63-313475 (1988), a joint box has recently been proposed in which the conductive circuits are made of covered electrical wires.

Heretofore, when the conductive circuits are made of covered wire, the wire is cut in lengths corresponding to each of tile conductive circuits so that these cut wires are coupled to connecting terminals in the joint box.

However, since this process is very complicated and takes a lot of time, the method disclosed in examined Japanese Public Publication No. 3-76086 (1991) was proposed to overcome this problem. In this method a path is formed by a plurality of protrusions on the insulation base and wire-coupling portions of the connecting terminals. The wire is laid on the insulation base in each of the conductive circuits by moving a wire-feeder along the path while feeding the wire to the insulation base and pushing the fed wire between the protrusions or into the wire-coupling portions of the connecting terminals. In this method, the wire is electrically contacted with the connecting terminals by pushing the wire into the wire-coupling portions. Also, In the method, the wire is cut when a circuit is formed by a single wire and the above operation is repeated at every circuit.

However, the method disclosed in the above publication causes the following problems.

First, since in the above method the wire is cut when the circuit is formed by a single wire, the feeding of the wire and the movement of the wire-feeder must be stopped at every cutting time and the wire-feeder must be displaced between a working station and non-working station on the insulation base. Thus, it takes a lot of time to make a circuit from one to the other, it is impossible to carry out a wiring while maintaining the wire-feeder at a high speed, and it is difficult to improve working efficiency.

Second, since a covered electrical wire with a single highly rigid core is used to form the conductive circuits in order to maintain a certain shape, a relatively strong force is required to bend the highly rigid wire into a desired shape. However, the protrusions forming the path are not strong enough to bend the wire since the insulation base is made of a synthetic resin. Consequently, the method disclosed in Japanese Publication No. 3-76086 causes the wire-feeder to be turned at the positions where the wire is to be bent so that a strong load is not applied to the protrusions.

Thus, the method disclosed in the above publication requires a mechanism which forcibly rotates the wire-feeder. This mechanism is expensive. Also, the working speed must be suppressed so that a strong impact is not applied to the protrusions. This makes it difficult to improve working efficiency.

In addition, since the path to guide the wire must be formed in the insulation base in the method disclosed in the above publication, it is difficult to make the base small, thereby making the junction box too large.

SUMMARY OF THE INVENTION:

An object of the present invention is to provide a method for laying a wire in a junction box, in which working steps are speeded up.

Another object of the present invention is to provide a method for laying a wire in a junction box, in which no limitation is applied to miniaturization of the junction box.

In order to achieve the above objects, a method in accordance with the present invention lays a wire in a junction box in which a plurality of connecting terminals are secured to an insulation base in each of the conductive circuits, said connecting terminals are provided with wire-coupling portions for receiving the wire and electrically contacting with the wire and the wires constituting each of said conductive circuits are laid on said base with the wires being inserted in said wire-coupling portions. The method comprises the steps of:

setting the wire on a wiring member along a wiring pattern arranged on said wiring member by causing a relative movement between a wire feeder which successively feeds a single wire and said wiring member along guide means formed on said wiring member;

cutting off portions unnecessary for said conductive circuits from the wiring set on said wiring member; and forming said conductive circuits in said junction box by inserting tile wire remaining on said wiring member into said wire-coupling portions of said connecting terminals secured to said base and by removing said junction box from said wiring member.

In the above method of wire-laying, said guide means are grooves formed along said wiring pattern on said wiring member and said step of setting the wire on said wiring member along said wiring pattern is carried out while inserting said wire feeder in said grooves.

In the above wire-laying method, said guide means are provided on bent portions of said wiring pattern.

According to the wire-laying method of the present invention, the wiring including a plurality of the conductive circuits in the junction box is formed for a very short time by successively setting the wire on the wiring member from the start point to the stop point on the wiring pattern on the wiring member. After cutting off any unnecessary portions for the above conductive circuits from the wiring set on the wiring member, the wire constituting the conductive circuits is laid in the junction box by inserting the wire remaining on the wiring member into the wire-coupling portions of the connecting terminals secured to the insulation base.

Further, the wire arranged on the wiring member is held in the grooves constituting the guide means.

In addition, when making the bent portions of the conductive circuits, it is possible to move the wire-feeder along the wiring pattern rapidly and without hesitation.

Figure 1:
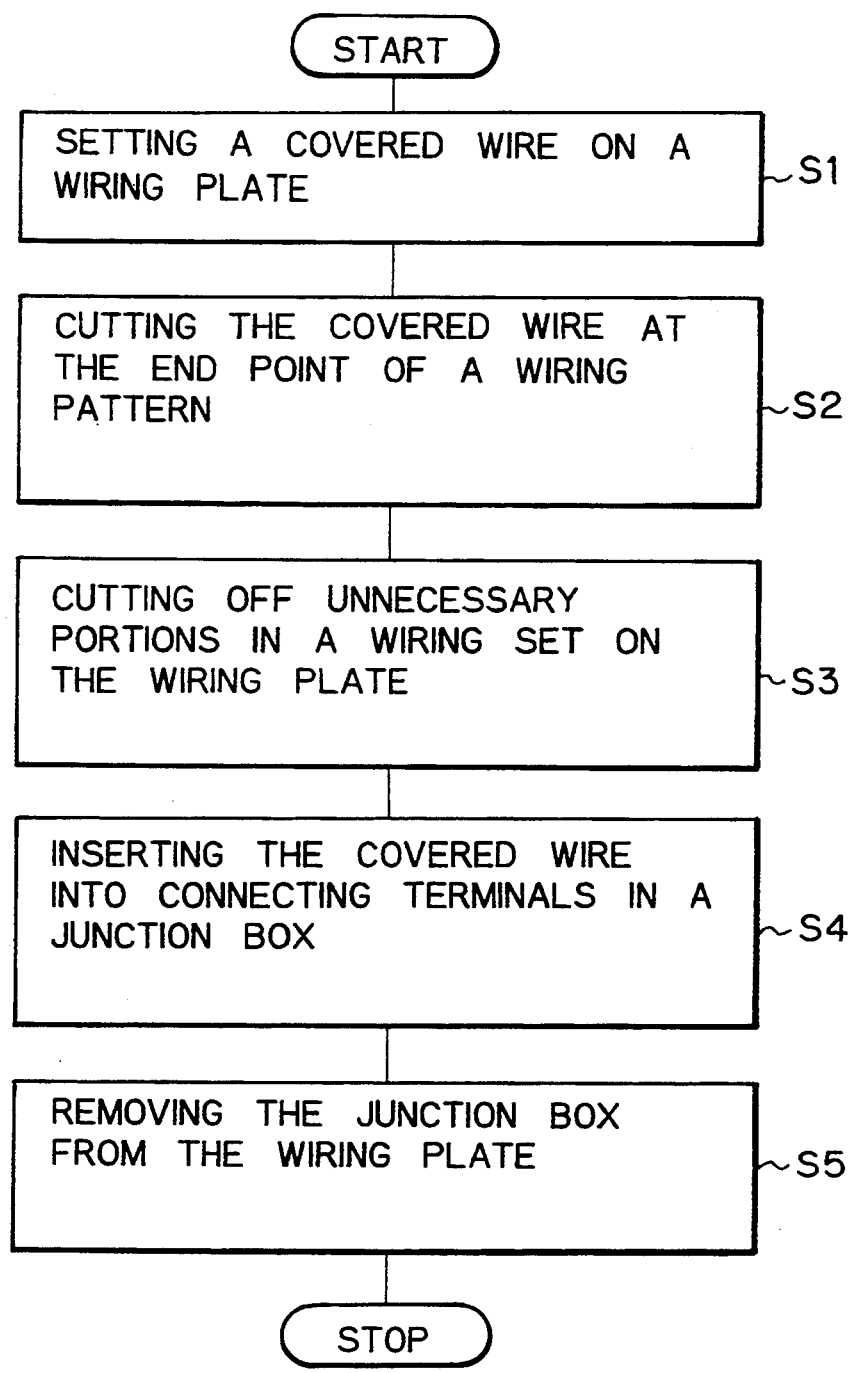
FIG. 1 is a flow chart illustrating a method for laying a wire in a junction box in accordance with an embodiment of the present invention.

DETAILED DESCRIPTION OF THE PREFERRED EMBODIMENTS:

Referring now to the drawings, an example of a method for laying a wire in a junction box in accordance with the present invention will be explained below.

Figure 2:
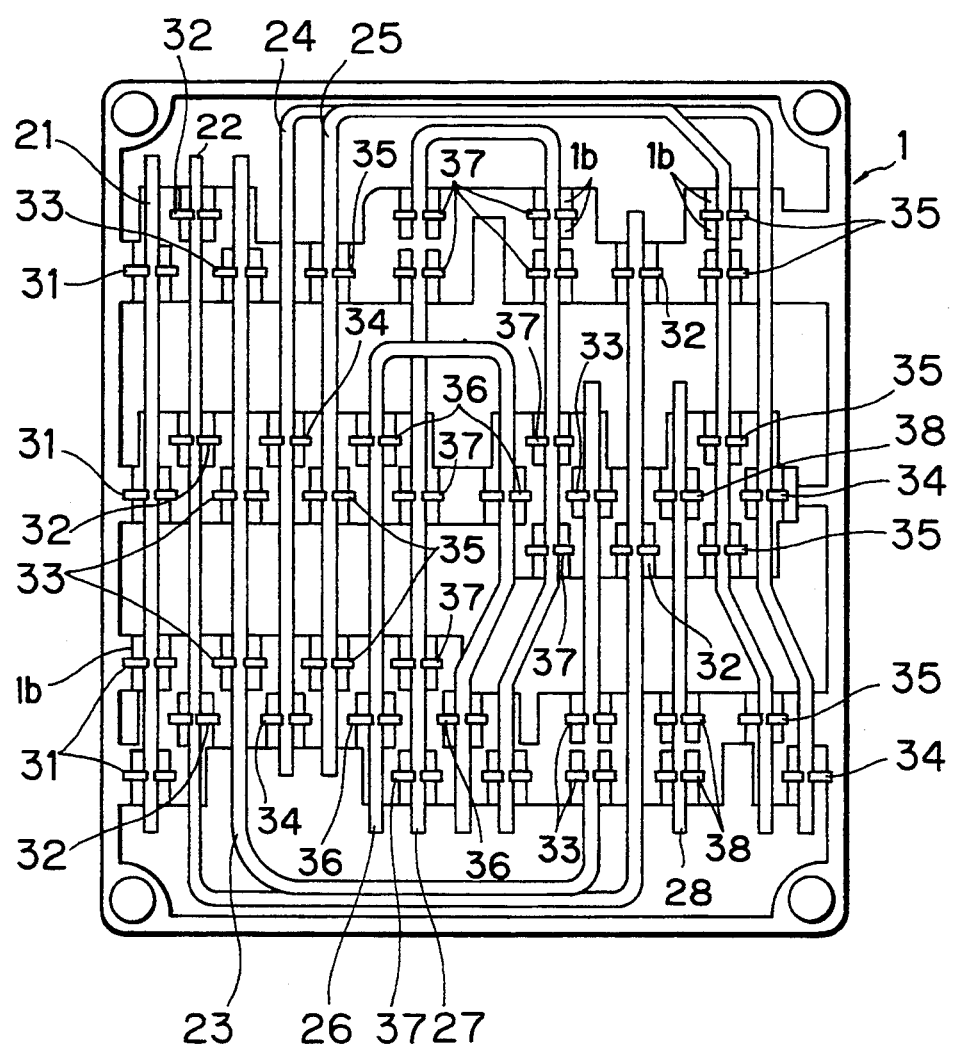
FIG. 2 is a plan view of the junction box.

A junction box shown in FIG. 2 comprises an insulation base 1, conductive circuits 21 to 28, and groups 31 to 38 of connecting terminals (in the drawings, each of the connecting terminals constituting each of the groups 31 to 38 are designated by the signs 31 to 38, respectively).

Figure 3:
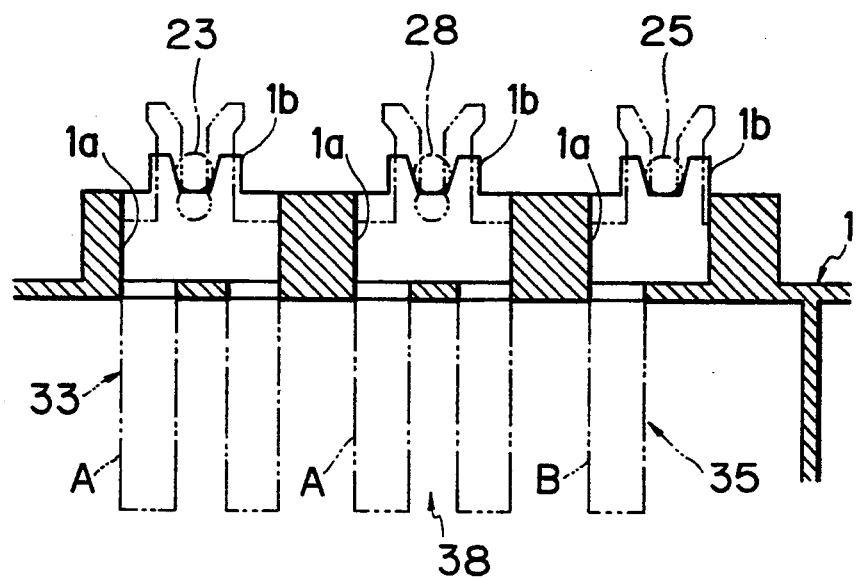
FIG. 3 is an enlarged cross sectional view of a main part of tile junction box.

The insulation base 1 is made of a resin material and is provided with a plurality of mounting holes 1a and wire-holding protrusions 1b adjacent to each of the holes 1a, as shown in FIG. 3.

The mounting holes 1a are formed in the base 1 so that each of the terminals 31 to 38 are inserted into and fixed in each of the holes 1a.

As shown in FIG. 3, the wire-holding protrusions 1b are formed closely on opposite sides of the holes 1a so that the protrusions 1b can receive the wire constituting the conductive circuits 21 to 28 when the wire is inserted between the protrusions 1a.

The conductive circuits 21 to 28 are eight circuits which are formed by laying a covered wire E on the insulation base 1 in the manner described below. In this embodiment, the covered wire may be a wire having a single core. In wiring for a motorcar, single core wire is 0.3 to 2 cm$^2$ in cross-sectional area.

Figure 4:
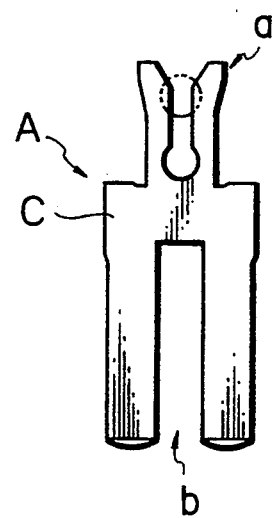
FIGS. 4A and 4B are plan views of connecting terminals.
Figure 4:
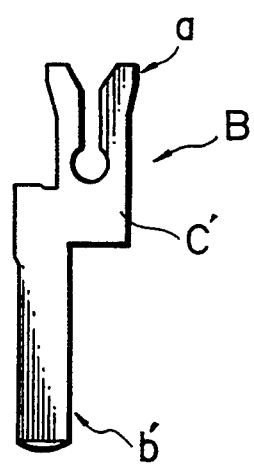

As described above, each of the connecting terminals 31 to 38 are inserted into and secured to the holes 1a in the insulation base 1. The connecting terminal may be either terminal A shown in FIG. 4A or terminal B shown in FIG. 4B. That is, the connecting terminals comprise the terminals A and B. The terminals A and B are provided with fork-like protrusions "a" which can receive the covered wire constituting the conductive circuits 21 to 28 and contact with the cores of the wires.

These fork-like protrusions "a" can contact with the cores of the wire by breaking the cover on the core of the wire when the wire is inserted between the protrusions "a". The terminal A has a branched contact portion "b" while the terminal B has a non-branched portion "b". The terminals A and B are secured to the insulation base 1 with the protrusions "a" being projected outwardly by fit-pressing on the interiors of the holes 1a, a portion "c" or "c'" interconnecting the portions "a" and "b"0 or "a'" and "b'".

Referring now to FIG. 1, a method of forming the conductive circuits 21 to 28 in the junction box constructed above is explained below in accordance with the following steps S1 to S2.

Figure 5:
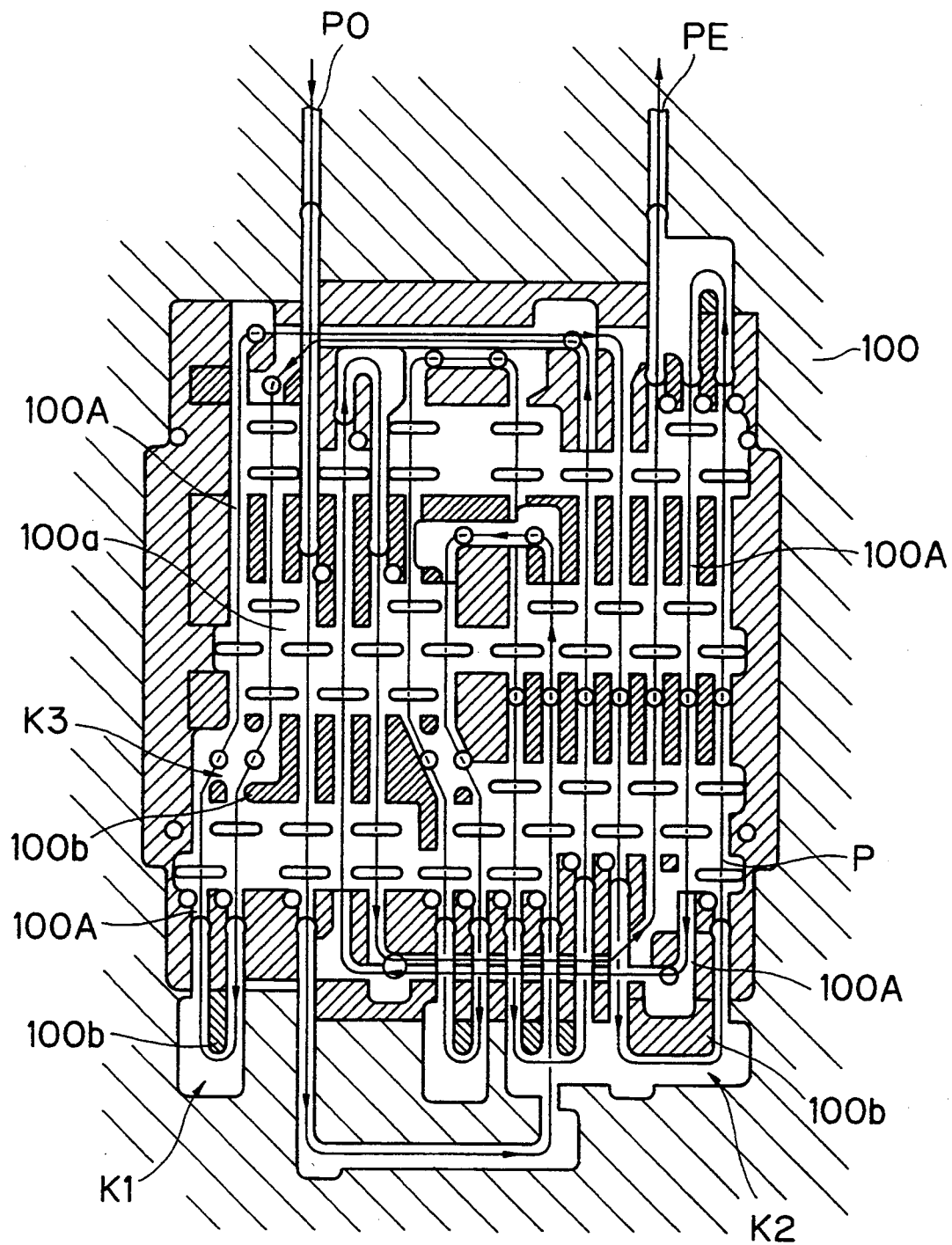
FIG. 5 is a plan view illustrating a wiring pattern of wires on a wiring plate.

In a first step S1, the covered wire is set on a metal wiring plate 100 shown in FIG. 5.

Figure 6:
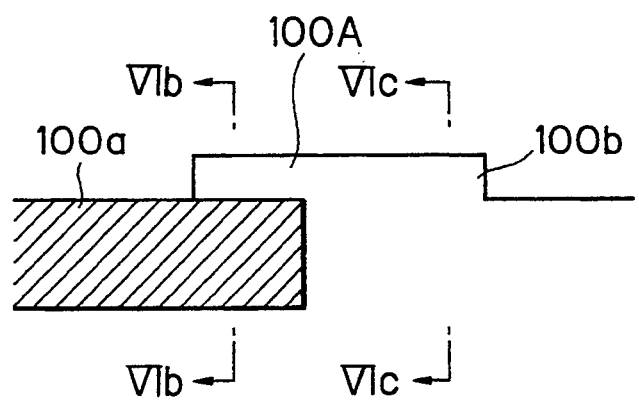
FIGS. 6A, 6B, and 6C are explanatory views of grooves on the wiring plate, FIGS. 6B and 6C being cross-sectional views taken along lines VIb—VIb and lines VIc—VIc in FIG. 6A.
Figure 6:
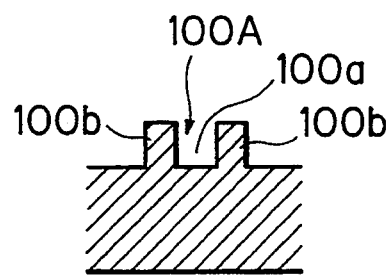
Figure 6:
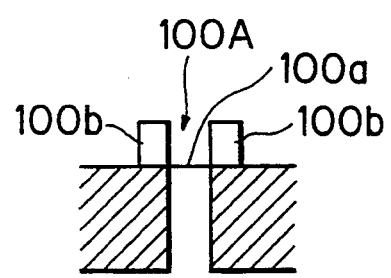
Figure 8:
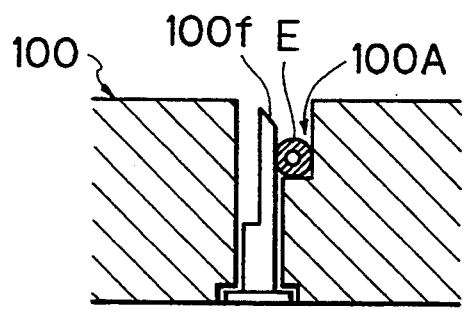
FIG. 8 is a side view of a wire-fixing pin.
Figure 9:
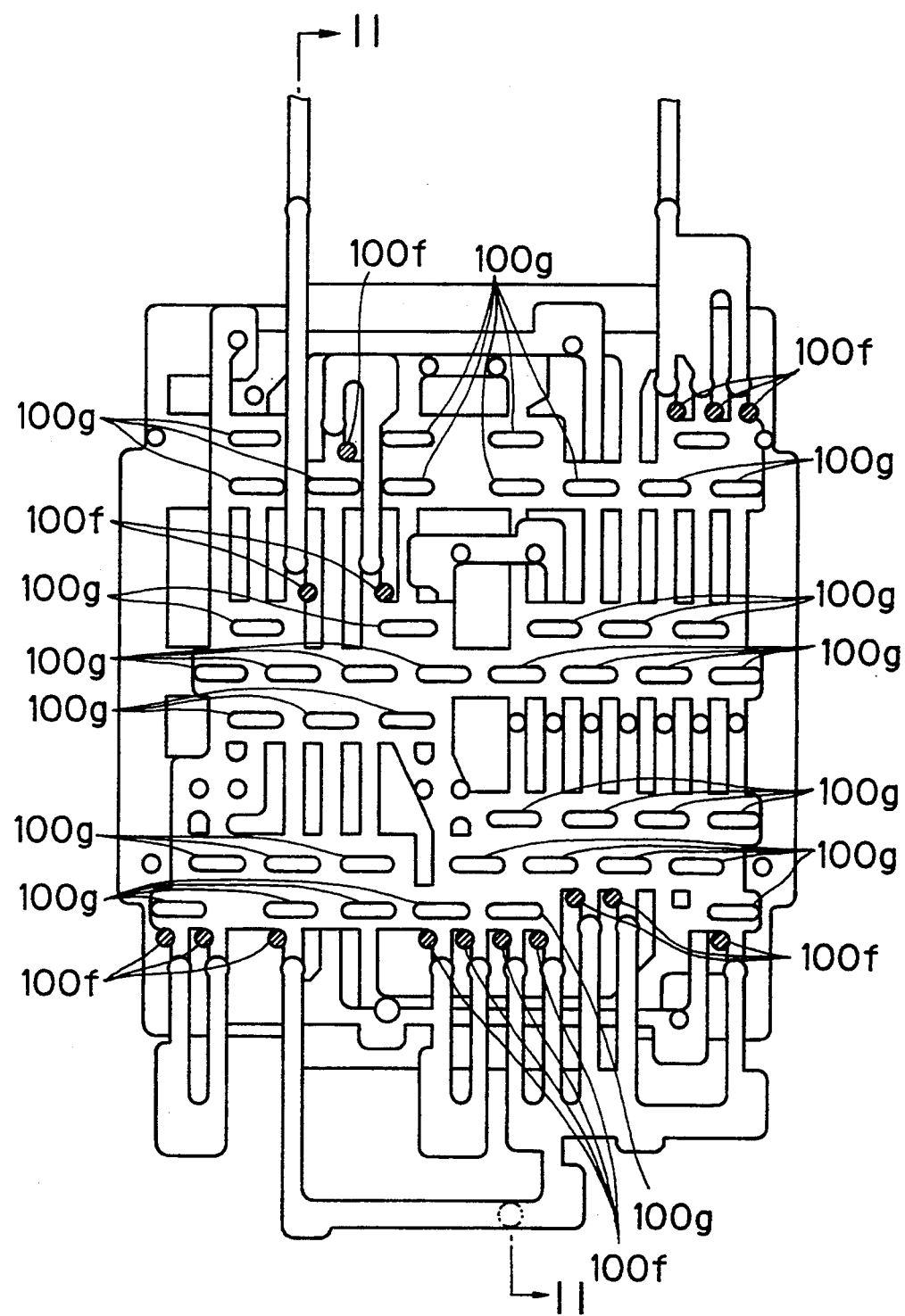
FIG. 9 is an explanatory view illustrating the wire-fixing pins and recesses on the wiring plate.

An imaginary wiring pattern P including the conductive circuits 21 to 28 in the junction box is set on the surface of the wiring plate 100. Grooves A (only a part of which is shown in FIG. 5) which guide a leading end 203f (see FIG. 7) of the wire mentioned hereinafter are formed on a given path along the wiring pattern P. The grooves A are also formed, as shown in FIG. 6, between protrusions 100b (hatched portions in FIG. 5) raised from a wire-bearing surface 100a. The grooves 100A are also provided with wire-fixing pins 100f shown in FIG. 8 at the hatching positions in FIG. 9. The pins 100f serve to fix the covered wire E between the side walls in the grooves 100A by elastically clamping the covered wire between the pins. Preferably, the pins 100f are provided near cutter pin-through portions 100d described hereinafter.

Figure 7:
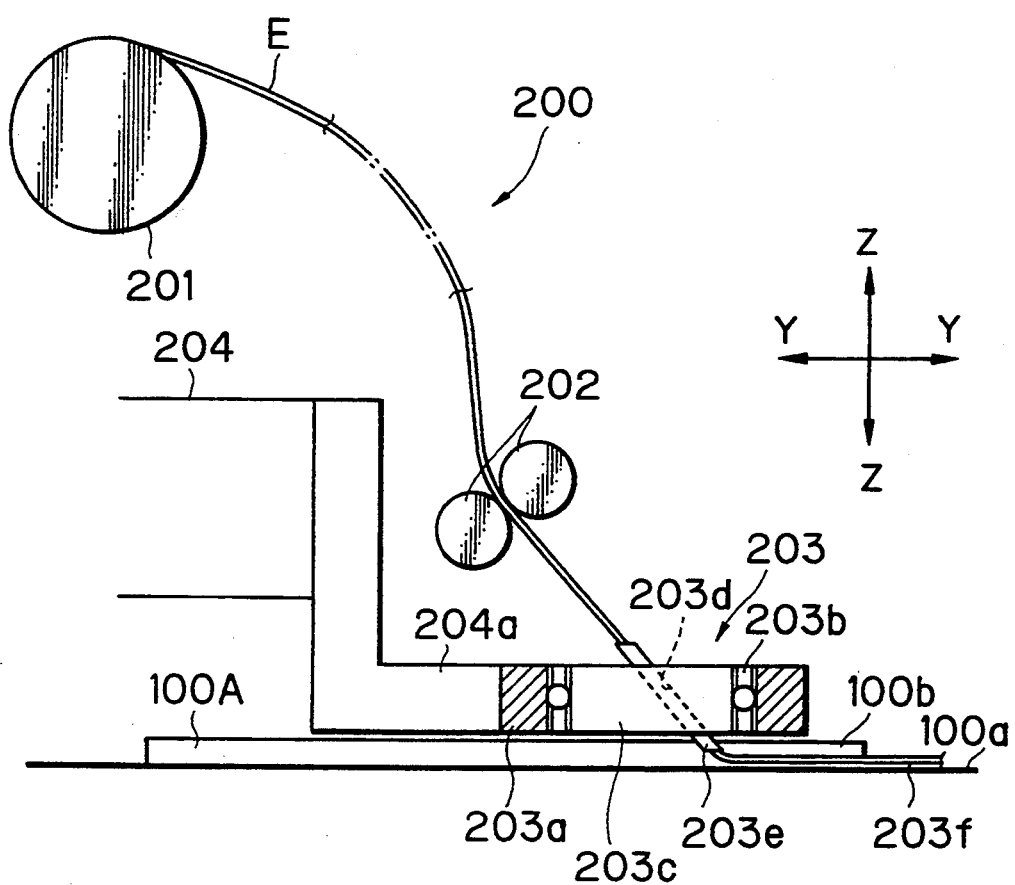
FIG. 7 is a schematic explanatory view of a wire-feeding device.

In step S1, the covered wire E is supplied to the wiring plate 100 by a wire-feeding device 200 shown in FIG. 7. The wire-feeding device 200 comprises a supply reel 201 which supplies the covered wire E, a pair of feeding rollers 202 driven by a motor (not shown), and a wire guide 203 which receives the wire E through the rollers 202 from the supply reel 201. The wire guide 203 includes a working unit 203c which is supported through a bearing 203b in a support ring 203a secured to an arm 204a of an X-Y robot 204. The working unit 203c can rotate about and move along a Z-axis relative to the support ring 203a. The working unit 203c is provided with a through hole 203d inclined by 45 degrees relative to the Z-axis and a wire-feeding nozzle 203c extending from the bottom of the through hole 203d in the inclined direction of the hole 203d.

When the covered wire E is laid on the wiring pattern P, as shown in FIG. 7, the X-Y robot 204 is moved along the given pattern with the nozzle 203e being disposed in the grooves 100A. Thus, the nozzle 203e is moved from a start point $P_O$ to a stop point $P_E$ on the wiring pattern P so that the wire E is laid in the grooves 100A on the wiring plate 100. Since the working unit 203c is rotatably disposed in the arm 204a of the X-Y robot 204, the working unit 203c is guided at turns on the pattern P, for example, turns K1 to K3 shown in FIG. 5, while applying a load to the protrusions 100b at the turns, thereby automatically turning the nozzle 203e.

That is, in step S1, even if the working unit 203c is not forcibly turned at the turns K1 to K3 on the wiring pattern P, the nozzle 203e can always be directed to the direction opposite to the moving direction of the nozzle. In addition, since the nozzle 203e is guided at the turns while applying a relatively high load to the protrusions 100b at the turns, it Is possible to move the nozzle 203e at a relatively high speed at the turns K1 to K3 in step S1 of laying the covered wire E on the wiring plate 100.

Further, in step S1, since the wiring can be carried out in a short time from the start point $P_O$ to the stop point $P_E$ on the pattern P, it is not necessary to move the nozzle 203e up and down while forming a wiring and it is necessary to start to move the nozzle only once. Accordingly, it is possible to reduce the time required for forming the conductive circuits 21 to 28 in comparison with the conventional method.

According to step S1 of laying the covered wire E on the plate, It is possible to directly set the wire E on the wiring plate 100 while moving the nozzle 203e around the protrusions 100b, and it is also possible to set the wire E around the turns with a substantially small curvature in comparison with, for example, the conventional method which puts on the wiring pattern a covered wire which has been bent beforehand.

A second step S2 cuts the covered wire E at the stop point $P_E$ so that the covered wire E set on the wiring plate 100 is separated from the covered wire E in the wire-feeding device 200. Step S2 follows step S1 of laying the wire E on the wiring plate 100 and preceedes a third step S3 (mentioned hereinafter) of cutting off unnecessary portions of the wiring at different stations. That is, the wiring plate 100 can move to a next working station by cutting the covered wire E at the stop point $P_E$.

Figure 11:
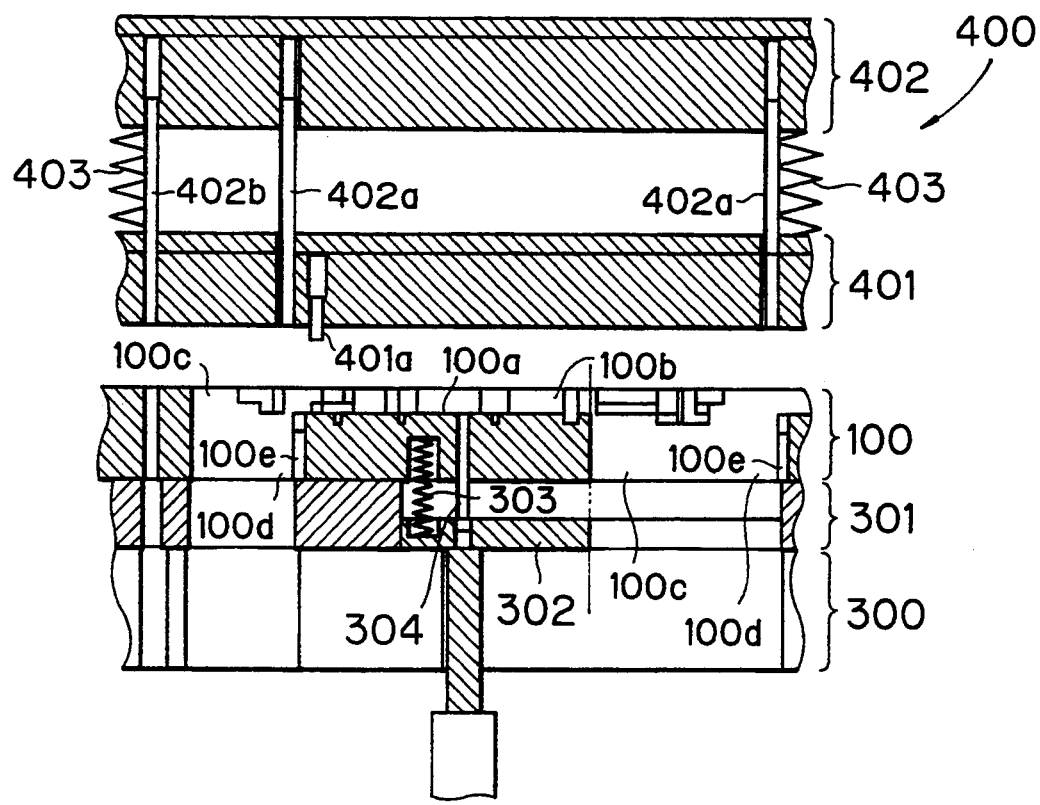
FIG. 11 is an explanatory view of the step of cutting off the unnecessary portions of the wires, in which a cutting jig is at a raised position.
Figure 12:
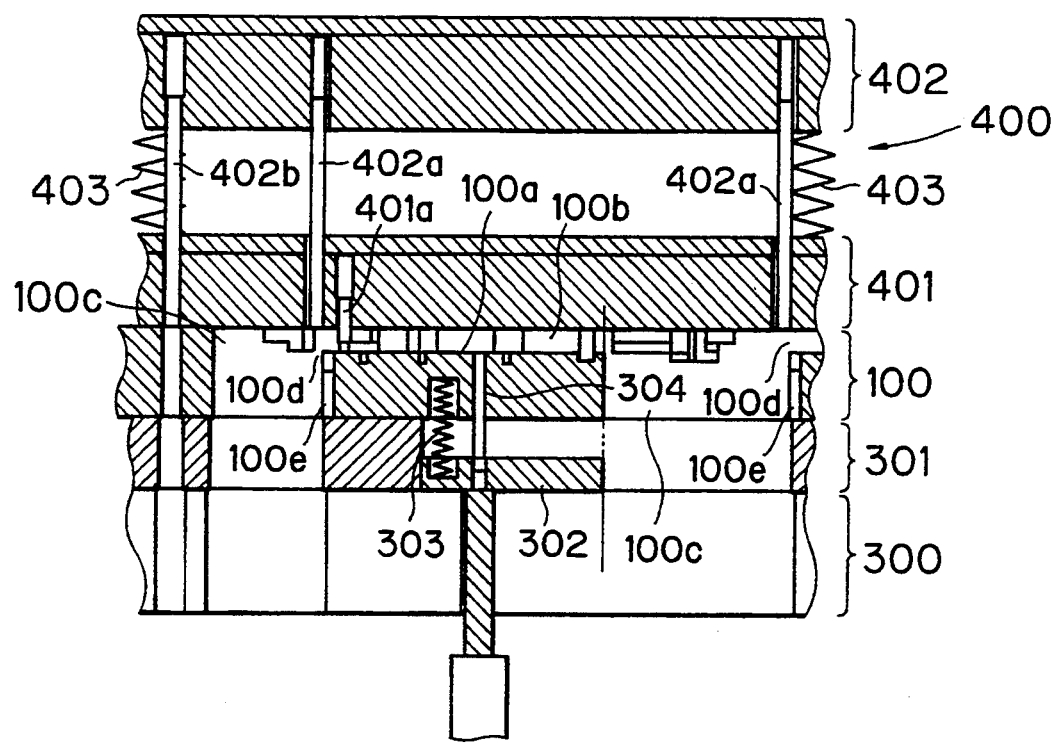
FIG. 12 is an explanatory view of the step, in which a pressing plate in the cutting jig is at a lowered position.
Figure 13:
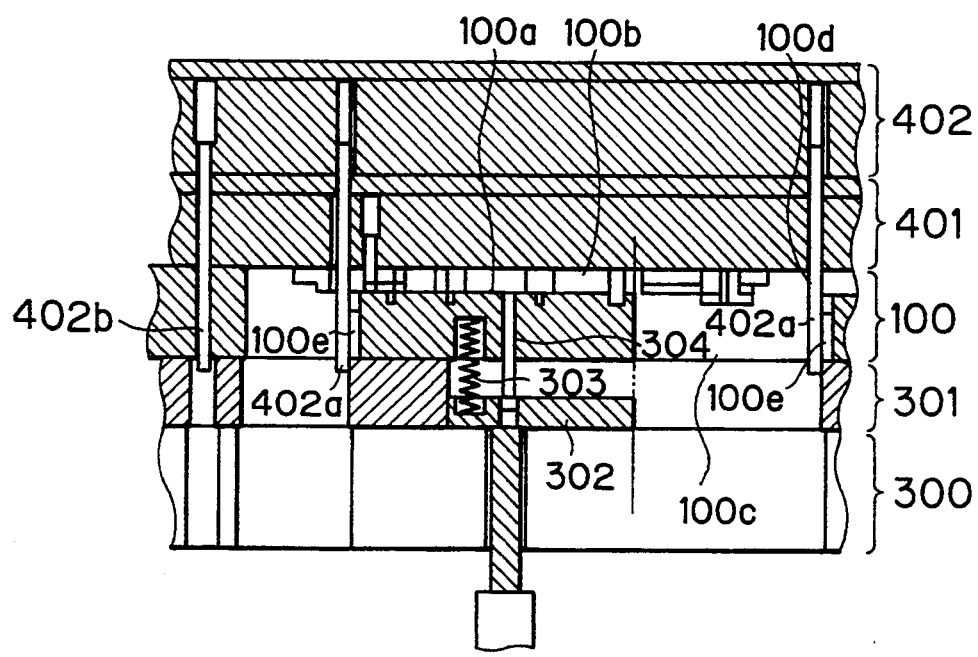
FIG. 13 is an explanatory view of the step, in which a cutting plate in the cutting jig is at a lowered position.

The third step S3 cuts off the covered wire E laid over holes 100c so that the unnecessary portions fall down through the holes 100c. The step S3 of cutting off the unnecessary portions of the wire is carried out by procedures shown in FIGS. 11 to 13. FIGS. 11 to 13 are cross-sectional views taken along lines X—X in FIGS. 9 and 10.

Figure 10:
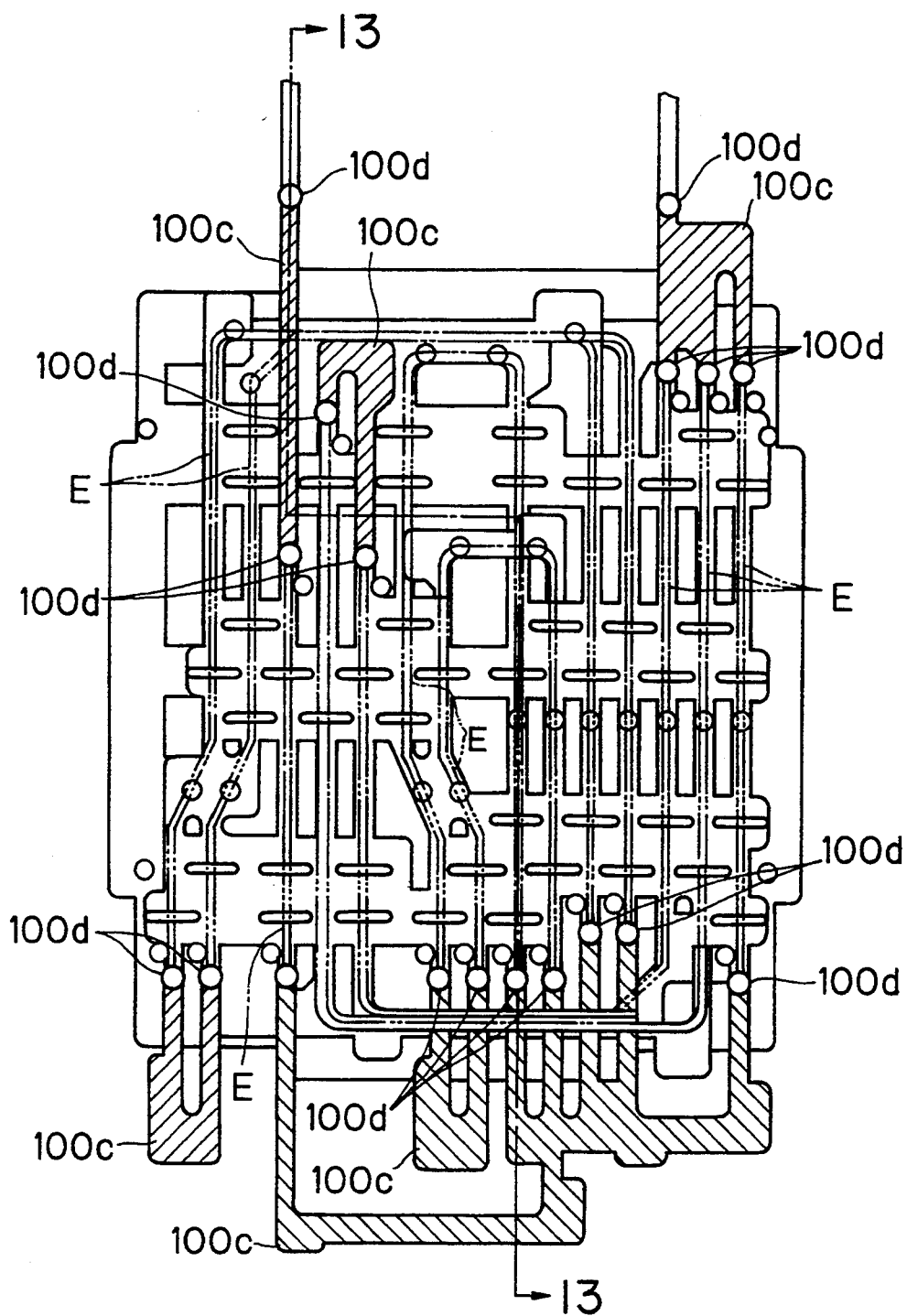
FIG. 10 is an explanatory view of holes in the wiring plate for receiving unnecessary portions of wires.

The holes 100c are formed in the hatched portions on the wiring plate 100 in FIG. 10, which overlap a part of the wiring pattern P. Cutter pin-passing through holes 100d (crosshatched portions in FIG. 10) with a circular shape in the plan view are formed in positions intersecting the wiring pattern P so that movable cutter pins 402a (see FIGS. 11 to 13) mentioned hereinafter can pass through the holes 100d. Further, the wiring plate 100 is provided with stationary cutter pins 100e (see FIGS. 11 to 13) at the positions intersecting the wiring pattern P and adjacent to the cutter pin-passing through holes 100d.

As shown in FIGS. 11 to 13, the wiring plate 100 is fitted and secured to a plate bed 301 fixed on a turntable 300. A cutting jig 400 having a pushing plate 401 and a cutter plate 402 over the pushing plate 401 is disposed over the wiring plate 100. The cutter plate 402 is positioned away from the pushing plate 401 by springs 403. The movable cutter pins 402a and ejector pins 402b are secured to the cutter plate 402. The pins 402a and 402b penetrate through the pushing plate 401 so that the top ends of the pins extend to the bottom of the pushing plate 401 in a normal condition. The pushing plate 401 is provided with wire pushing pins 401a which project downwardly from the bottom of the plate 401.

To effect step S3, as shown in FIG. 12, the whole cutting jig 400 is lowered until the pushing plate 401 contacts with the wiring plate 100. In this position, the pins 401a locally push down the covered wire E laid on the wiring plate 100. Thus, the covered wire E is prevented from moving on the wiring plate upon cutting the wire. Preferably, the positions where the covered wire E is pressed by the pins 401a are the same or near the positions where the covered wire E is fixed by the pins 100f.

In step S3, the cutter plate 402 is lowered against the spring 403, as shown in FIG. 11 to 13. Then, the cutter pins 402a are inserted into the portions 100d on the wiring plate 100 so that blades formed on the end of the pins 402a pass by blades formed on the top ends of the pins 100e fixed on the wiring plate 100.

The covered wire E laid on the wiring pattern P is cut at the positions corresponding to those of the through portions 100d by passing the movable pins 402a by the stationary cutter pins 100e. As shown in FIGS. 5 and 10, the wire over the holes 100c is cut off from the covered wire E set in the grooves 100A in the wiring plate 100 in step S3 and the cut wires fall down through the holes 100c.

As described above, step S3 of cutting off the unnecessary portions of the wire is carried out in a short time by the successive procedures of lowering the entire cutting jig 400 and lowering the cutter plate 402. In step S3, only the covered wire E constituting the conductive circuits in the junction box shown in FIG. 2 remains on the wiring plate 100.

Figure 14:
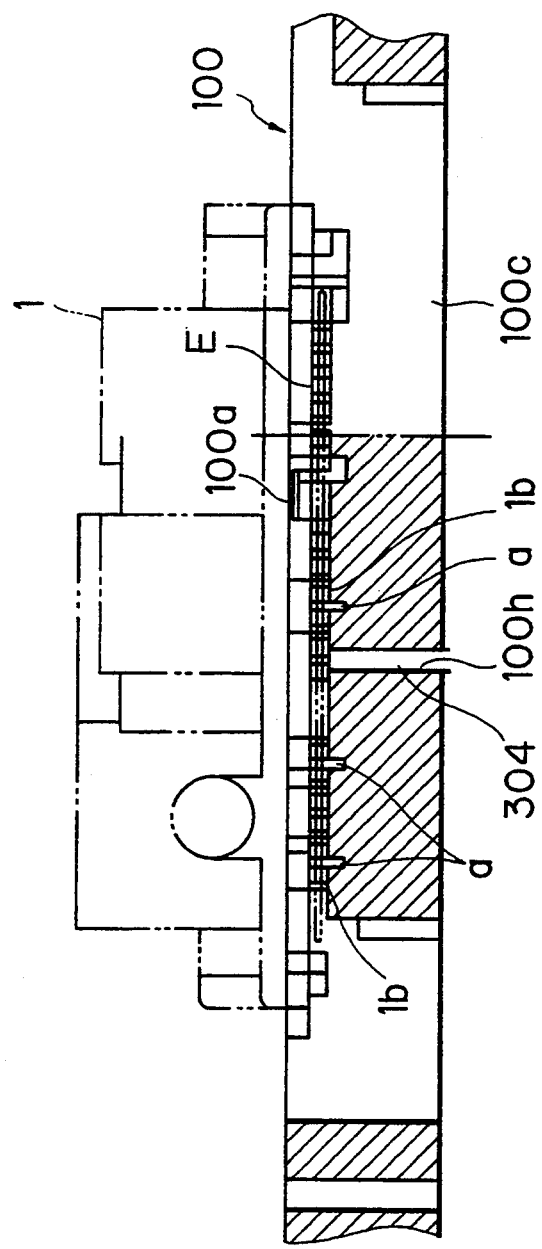
FIG. 14 is an explanatory view of the step of transferring the wires on the wiring plate to a junction box.
Figure 15:
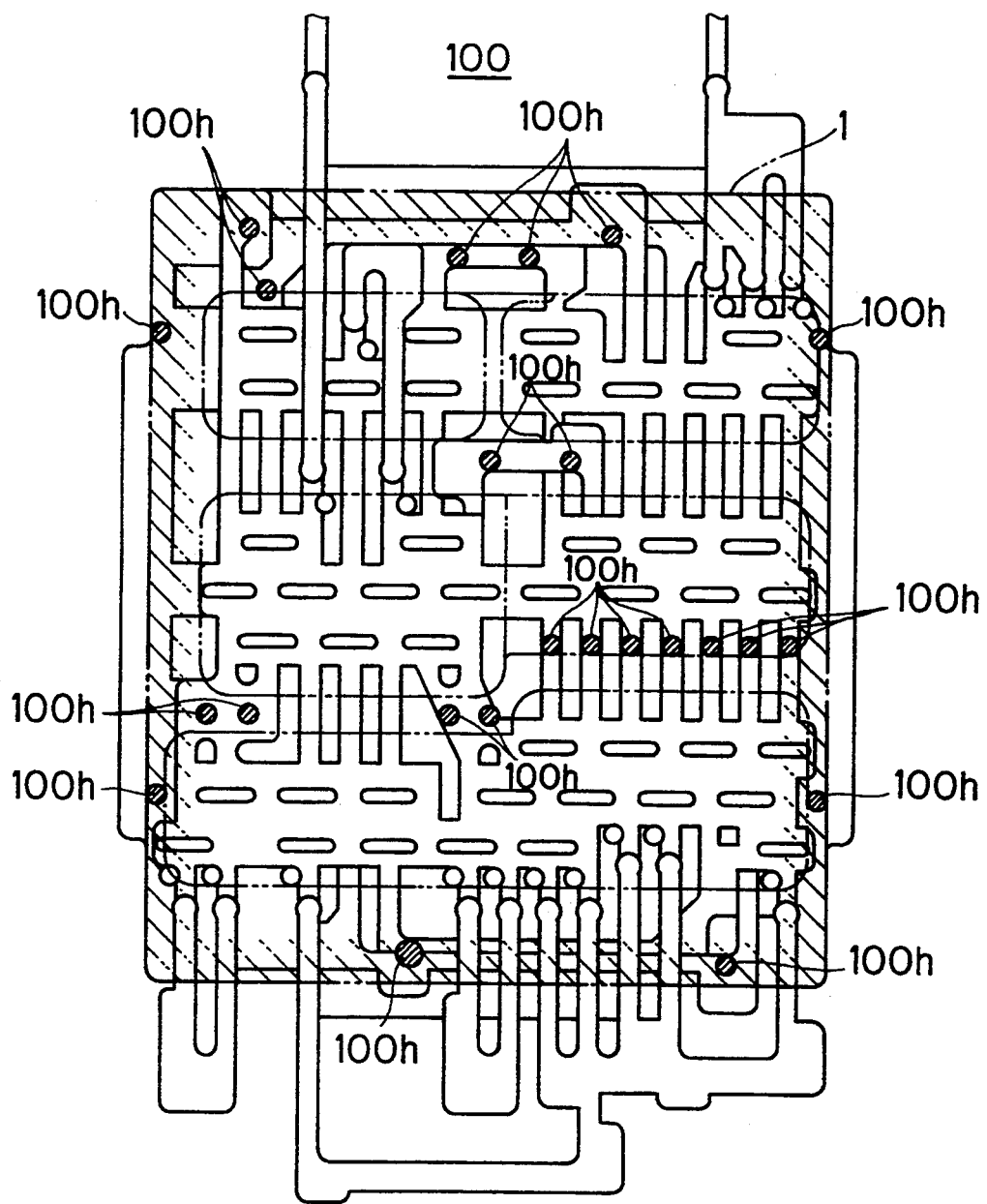
FIG. 15 is a plan view of the junction box on the wiring plate.

A fourth step 24 transfers the covered wire E held on the wiring plate 100 to the junction box. This transference is effected by pressing the wire-laid surface of the insulation base 1 with the connecting terminals 31 to 38 onto the covered wire-laid surface of the wiring plate 100, as shown in FIGS. 14 and 15.

The insulation base 1 is a substantially rectangular shape in a plan view and is positioned on the wiring plate 100 by mating the four corners of the base with recesses formed in the wiring plate 100. The wiring plate 100 is provided with recesses 100g (crosshatched portions in FIG. 9) on the wire-laid surface of the wiring plate 100 in opposition to each of the connecting terminals A and B of the connecting terminal groups 31 to 38 in the junction box to be pressed onto the wire-laid surface. The wire-connecting portions "a" of the connecting terminals A or B are inserted into the recesses 100g.

In other words, the wire-holding portions 1b on the insulation base 1 contact with the wire-laid surface 100a of the wiring plate 100 and the top ends of the wire-connecting portions "a" are inserted into the recesses 100g. When the portions "a" are Inserted into the recesses 100g, the covered wire E on the surface 100a is inserted into the forks of the portions "a" of each of the connecting terminals A or B. As described above, the cover of the wire E is broken, by the portions "a" simultaneously with insertion of the wire into the portions "a", thereby electrically contacting the core of the wire with the portions "a". Thus, the covered wire E which is inserted into the portions "a" and electrically connected to it is simultaneously held in the holding portions 1b.

A fifth step S5 removes the junction box from the wiring plate 100.

As shown in FIGS. 11 to 13, a pushing-up plate 802 is held down by springs 308 in the normal condition in the plate bed 301 on the wiring plate 100. The wiring plate 100 is provided with pin-through holes 100h at the given hatched positions in FIG. 15. Pushing-up pins 304 are secured to the pushing-up plate 302 so that the top ends of the pins 304 are disposed on the same plane as the wire-laid surface 100a of the wiring plate 100 with the pins being inserted into the holes 100h and the pushing-up plate 302 being pushed down by the spring 303.

The pushing-up pins 304 project from the wire-laid surface 100a and push up the junction box by moving the pushing-up plate 302 upwardly against the spring 303. It will be apparent from FIG. 5 that almost all the pushing-up pins 304 push up the covered wire E constituting the conductive circuits 21 to 28 so as to push up the junction box.

The covered wire E constituting the conductive circuits 21 to 28 is held in the wire-connecting portions "a" of each connecting terminal A or B constituting the connecting terminals 31 to 38. Accordingly, when the junction box is removed from the wiring plate 100, the covered wire E is slid out of the grooves A in the wiring plate 100 as a part of the junction box.

It will be apparent from the foregoing that steps S1 to S2 can complete the laying of the wire on the plate to form the conductive circuits irrespective of the number of conductive circuits. Further, step S1 is completed in a very short time by laying the wire from the start point to the stop point on the wiring including all of the conductive circuits. Also, steps S2 to S5 can be completed in a very short time, respectively, by merely repeating simple pressing operations. Step S3 may be carried out simultaneously with step S2.

Figure 16:
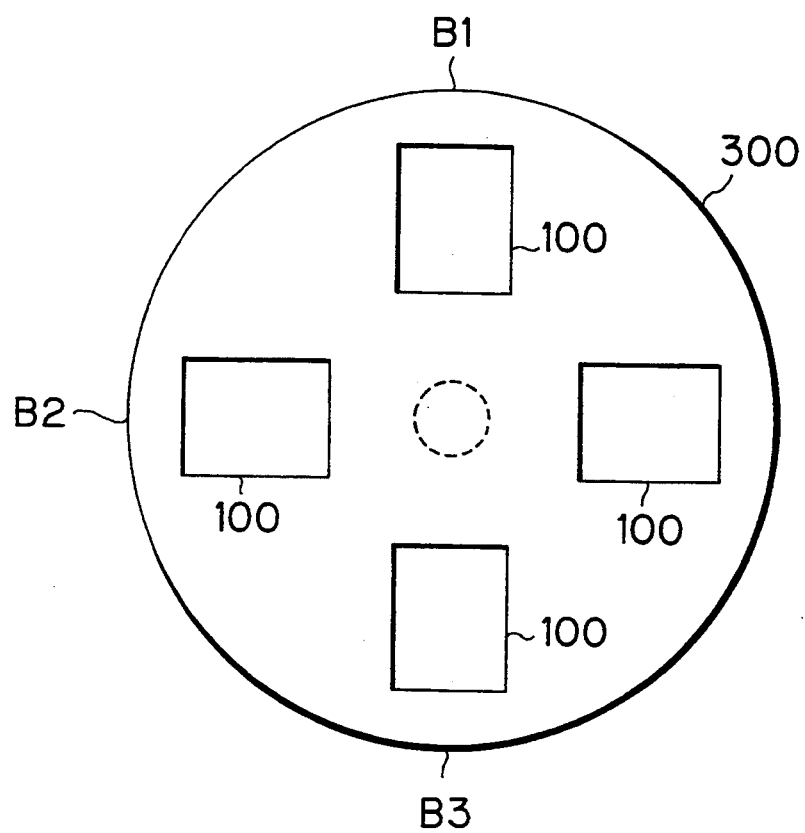
FIG. 16 is a schematic plan view of an apparatus carrying out the method of the present invention.

In the above embodiment, as shown in FIG. 16, four wiring plates 100 are placed at an equal distance on the periphery of the turntable 300 and the turntable 300 rotates about a rotary axis. For example, steps S1 and S2 are effected at position B1, step S3 is effected at position B2 rotated 90 degrees from B1, and steps S4 and S5 are effected at position B3 rotated 90 degrees from position B2. Thus, a plurality of workings can be carried out at the same time in a relatively small space, thereby obtaining a high working efficiency.

The junction box in which the conductive circuits are laid in accordance with the method of the present invention is not limited to the above embodiment. The junction box may be one in which a plurality of connecting terminals divided into the respective groups in each conductive circuit are secured to the insulation base, the wire can be inserted into the connecting terminals and the wire is electrically contacted with the wire-connecting portions, and the wire constituting the respective conductive circuits is laid on the insulation base with the wire being inserted into the wire-connecting portions.

According to the present invention, it is possible to speed up the laying work in the junction box, since any working step need not be increased even if the number of conductive circuits are increased, and the wiring including the conductive circuits can be formed in a short time. This effect is even more important in the case of an increase in the number of conductive circuits.

The wire-laying according to the method of the present invention need not form a junction box which is too large. Further, the wire can be accurately and rapidly laid on the wiring pattern set on the wiring plate. It is also possible to rapidly form the turns of the conductive circuits by laying the wire along the grooves and to form the turns with a smaller curvature than that in the conventional turns.

What is claimed is:

1. An apparatus for cutting predetermined portions of a wire set in a pattern on a wiring plate, said apparatus comprising a cutting jig having a plurality of first cutter blades mounted thereon at locations corresponding to said portions, said cutting jig and said wiring plate adapted for movement between a first position, spaced apart from each other, and a second position adjacent each other, whereby movement from said first position to said second position causes said first blades to cut said portions to form severed pieces of said wire, holes in said wiring plate at said portions whereby said several portions are permitted to fall therethrough.

2. The apparatus of claim 1 wherein guides in said wiring plate are adapted to receive said wire in said pattern.

3. The apparatus of claim 2 wherein said guides are grooves.

4. The apparatus of claim 2 wherein said guides are at bent portions of said pattern.

5. The apparatus of claim 1 wherein there is a plurality of second cutting blades mounted on said wiring plate at said portions and complementary to said first blades, whereby said movement causes said first blades and said second blades to pass closely, thereby exerting a shearing action on said portions.

6. The apparatus of claim 1 wherein said wiring plate is stationary and said cutting jig is movable from said first position to said second position.

7. The apparatus of claim 2 wherein said wire is on a wire bearing surface of said wiring plate, and said guides are protrusions upstanding from said bearing surface.

8. The apparatus of claim 7 wherein parts of said wire are retained between at least one wire fixing pin on said wiring plate and at least one of said protrusions, an insulated plate onto which said wire is to be transferred from said wiring plate, recesses in said insulated plate adapted to receive connecting terminals for said wire.

9. The apparatus of claim 8 wherein said terminals each comprise a fork and a base, said wire in said fork and tines of said fork adapted to pierce said wire and make electrical contact therewith, said base being in one of said recesses.

* * * * *